US00RE49992E

(19) United States
(12) Reissued Patent
Lee et al.

(10) Patent Number: US RE49,992 E
(45) Date of Reissued Patent: May 28, 2024

(54) ORGANIC LIGHT-EMITTING DIODE DISPLAY

(71) Applicant: Samsung Display Co., Ltd., Yongin-si (KR)

(72) Inventors: Seung-Kyu Lee, Asan-si (KR); Chae Han Hyun, Cheonan-si (KR); Mi Hae Kim, Asan-si (KR); Myeong Hee Seo, Cheonan-si (KR); Ki Myeong Eom, Suwon-si (KR); Ji-Eun Lee, Seoul (KR)

(73) Assignee: SAMSUNG DISPLAY CO., LTD., Yongin-si (KR)

(21) Appl. No.: 17/723,394

(22) Filed: Apr. 18, 2022

Related U.S. Patent Documents

Reissue of:
(64) Patent No.: 9,780,331
Issued: Oct. 3, 2017
Appl. No.: 14/939,837
Filed: Nov. 12, 2015

U.S. Applications:
(63) Continuation of application No. 16/589,776, filed on Oct. 1, 2019, now Pat. No. Re. 49,048, which is an application for the reissue of Pat. No. 9,780,331.

(30) Foreign Application Priority Data

Apr. 29, 2015 (KR) ..... 10-2015-0060541

(51) Int. Cl.
*H01L 27/32* (2006.01)
*G09G 3/3233* (2016.01)
(Continued)

(52) U.S. Cl.
CPC ..... *H10K 50/844* (2023.02); *G09G 3/3233* (2013.01); *H10K 59/1213* (2023.02);
(Continued)

(58) Field of Classification Search
CPC ..... G09G 3/3233; G09G 2300/0819; G09G 2300/0842; G09G 2320/045;
(Continued)

(56) References Cited

U.S. PATENT DOCUMENTS 9,117,783 B2 8/2015 Jin
2009/0040407 A1* 2/2009 Kim ..... G02F 1/136213 349/39
(Continued)

FOREIGN PATENT DOCUMENTS

JP 2009-37100 2/2009
JP 2009-37100 A 2/2009
(Continued)

OTHER PUBLICATIONS

Non-Final Office Action dated Jan. 4, 2017, issued in U.S. Appl. No. 14/939,819.
(Continued)

*Primary Examiner* — Ling X Xu
(74) *Attorney, Agent, or Firm* — KILE PARK REED & HOUTTEMAN PLLC

(57) ABSTRACT

An organic light-emitting diode display is disclosed. In one aspect, the display includes a scan line formed over a substrate, a data line formed over the substrate, and a driving voltage line configured to receive a driving voltage. The data line and driving voltage line cross the scan line and are electrically insulated from the scan line. A switching transistor is electrically connected to the scan line and the data line and includes a switching drain electrode. A driving transistor includes a driving source electrode electrically connected to the switching drain electrode and a driving gate electrode including a first storage electrode. A storage line includes a second storage electrode overlapping the first storage electrode. An OLED is electrically connected to the
(Continued)

driving transistor, the second storage electrode including an extension at least partially overlapping the data line.

20 Claims, 7 Drawing Sheets

(51) Int. Cl.
*H01L 51/52* (2006.01)
*H10K 50/844* (2023.01)
*H10K 59/121* (2023.01)
*H10K 59/131* (2023.01)

(52) U.S. Cl.
CPC ..... *H10K 59/1216* (2023.02); *H10K 59/131* (2023.02); *G09G 2300/0819* (2013.01); *G09G 2300/0842* (2013.01); *G09G 2300/0861* (2013.01); *G09G 2320/045* (2013.01)

(58) Field of Classification Search
CPC ..... G09G 2300/0861; H01L 51/5253; H01L 27/3262; H01L 27/3265; H01L 27/3276
See application file for complete search history.

(56) References Cited

U.S. PATENT DOCUMENTS

2011/0025585 A1 2/2011 Kim et al.
2012/0099042 A1* 4/2012 Lee ..... G02F 1/13392 349/43
2013/0328049 A1* 12/2013 Choi ..... H01L 29/41733 257/57
2014/0353629 A1 12/2014 Jin
2015/0042634 A1* 2/2015 Jin ..... G09G 3/3648 345/212
2015/0160523 A1 6/2015 Fukami
2015/0200239 A1* 7/2015 Jung ..... H01L 27/3276 257/40
2016/0005804 A1 1/2016 Oh et al.

FOREIGN PATENT DOCUMENTS

KR 10-0570627 4/2006
KR 10-0570627 B1 4/2006
KR 10-2012-0110888 10/2012
KR 10-2012-0110888 A 10/2012
KR 10-2014-0108023 A 5/2014
KR 10-2014-0077002 6/2014
KR 10-2014-0077002 A 6/2014
KR 10-2014-0086510 7/2014
KR 10-2014-0086510 A 7/2014
KR 10-2014-0108023 9/2014
KR 10-2014-0140967 12/2014

OTHER PUBLICATIONS

Notice of Allowance dated May 8, 2017, issued in U.S. Appl. No. 14/939,819.
Non-Final Office Action dated Jan. 19, 2017, issued in U.S. Appl. No. 14/939,837.
Notice of Allowance dated May 30, 2017, issued in U.S. Appl. No. 14/939,837.
Non-Final Office Action dated Apr. 19, 2021, in U.S. Appl. No. 16/589,776.
Final Office Action dated Aug. 17, 2021, in U.S. Appl. No. 16/589,776.
Notice of Allowance dated Nov. 24, 2021, in U.S. Appl. No. 16/589,776.

* cited by examiner

ORGANIC LIGHT-EMITTING DIODE DISPLAY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

INCORPORATION BY REFERENCE TO ANY PRIORITY APPLICATIONS

This application *is a continuation reissue of application Ser. No. 16/589,776, which is an application for reissue of U.S. Pat. No. 9,780,331, filed on Nov. 12, 2015 as U.S. patent application Ser. No. 14/939,837 and issued on Oct. 3, 2017, and* claims priority to and the benefit of Korean Patent Application No. 10-2015-0060541 filed in the Korean Intellectual Property Office on Apr. 29, 2015, the entire contents of which are incorporated herein by reference.

This application relates to U.S. patent application entitled "Organic Light-Emitting Diode Display" (application Ser. No. 14/939,819), which is concurrently filed with this application and incorporated herein by reference in its entirety.

BACKGROUND

Field

The described technology generally relates to an organic light-emitting diode display.

Description of the Related Technology

An organic light-emitting diode (OLED) includes two electrodes and an interposed organic emission layer. The OLED forms excitons by combining electrons injected from one electrode with holes injected from another electrode at the organic emission layer and emits light by allowing the excitons to emit energy. An OLED display includes a matrix of pixels where each pixel includes transistors and storage capacitors for driving the OLED. The transistor and the storage capacitor are configured with a plurality of wirings including a semiconductor, a gate line, a data line, or the like.

In this case, a change in voltage of the data line affects a voltage of a driving gate node of the driving transistor due to a parasitic capacitance formed between a driving gate node and a data line connected to a driving gate electrode of the driving transistor. The change in voltage of the driving gate node changes a driving current flowing in the OLED to cause a vertical crosstalk phenomenon which leads to a change in luminance.

To prevent this phenomenon, an interval between the data line and the driving gate node is formed to be as far apart as possible, but as resolution increases, the size of the pixel is reduced and a process design rule may not be continuously reduced due to a limitation of facility specification and photolithography process capability, such that there is a limitation in minimizing the vertical crosstalk.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can minimize vertical crosstalk in a high resolution structure.

Another aspect is an OLED display, including: a substrate; a scan line positioned on the substrate; a data line and a driving voltage line applied with a driving voltage, intersecting with the scan line while being insulated from the scan line; a switching transistor connected to the scan line and the data line and including a switching drain electrode; a driving transistor including a driving source electrode connected to the switching drain electrode and a first storage electrode which is a driving gate electrode; a storage line including a second storage electrode overlapping with the first storage electrode; and an OLED connected to the driving transistor, wherein the second storage electrode includes an extension overlapping with the data line.

The second storage electrode can be an extended portion of the storage line and the extension can extend in a length direction of the data line.

The second storage electrode can have an area wider than that of the first storage electrode.

The second storage electrode can be connected to the driving voltage line.

The OLED display can further include: a semiconductor layer positioned on the substrate and including a switching channel of the switching transistor and a driving channel of the driving transistor; and a first gate insulating layer positioned on the semiconductor layer.

The driving channel can be curved on a plane.

The OLED display can further include: a second gate insulating layer positioned on the first storage electrode, wherein the first storage electrode is positioned on the first gate insulating layer The second storage electrode can be positioned on the second gate insulating layer and the first storage electrode and the second storage electrode can form a storage capacitor.

The OLED display can further include: an interlayer insulating layer covering the second storage electrode, wherein the data line and the driving voltage line are positioned on the interlayer insulating layer.

The OLED display can further include: a light emission control line extending parallel with the scan line and transferring a light emission control signal; and an operation control transistor turned on by the light emission control signal to transfer the driving voltage to the driving transistor.

The operation control transistor can include: an operation control gate electrode which is a portion of the light emission control line; an operation control channel overlapping the operation control gate electrode and positioned on the semiconductor layer; and an operation control source electrode and an operation control drain electrode positioned on the semiconductor layer and each positioned at both sides of the operation control channel.

The OLED display can further include: a passivation layer covering the interlayer insulating layer, wherein the OLED includes a pixel electrode positioned on the passivation layer, an organic emission layer positioned on the pixel electrode, and a common electrode positioned on the organic emission layer.

Another aspect is an organic light-emitting diode (OLED) display, comprising: a substrate; a scan line formed over the substrate; a data line formed over the substrate; a driving voltage line configured to receive a driving voltage, wherein the data line and driving voltage line cross the scan line and are electrically insulated from the scan line; a switching transistor electrically connected to the scan line and the data line and including a switching drain electrode; a driving transistor including a driving source electrode electrically connected to the switching drain electrode and a driving gate electrode including a first storage electrode; a storage line including a second storage electrode overlapping the first storage electrode in the depth dimension of the OLED display; and an OLED electrically connected to the driving transistor, wherein the second storage electrode includes an extension at least partially overlapping the data line in the depth dimension of the OLED display.

In the above OLED display, the extension includes an extended portion of the storage line which extends in a length direction of the data line.

In the above OLED display, the second storage electrode has an area greater than that of the first storage electrode.

In the above OLED display, the second storage electrode is electrically connected to the driving voltage line.

The above OLED display further comprises: a semiconductor layer formed over the substrate and including a switching channel of the switching transistor and a driving channel of the driving transistor; and a first gate insulating layer formed over the semiconductor layer.

In the above OLED display, the driving channel is non-linear.

The above OLED display further comprises a second gate insulating layer formed over the first storage electrode, wherein the first storage electrode is formed over the first gate insulating layer.

In the above OLED display, the second storage electrode is formed over the second gate insulating layer, wherein the first and second storage electrode form a storage capacitor.

The above OLED display further comprises an interlayer insulating layer formed over the second storage electrode, wherein the data line and the driving voltage line are formed over the interlayer insulating layer.

The above OLED display further comprises: a light emission control line extending substantially in parallel with the scan line and configured to transfer a light emission control signal; and an operation control transistor configured to be turned on based on the light emission control signal and transfer the driving voltage to the driving transistor.

In the above OLED display, the operation control transistor includes: the light emission control line configured to function as an operation control gate electrode of the operation control transistor; an operation control channel overlapping the operation control gate electrode in the depth dimension of the OLED display and formed over the semiconductor layer; and an operation control source and drain electrodes formed over the semiconductor layer and each ao located at opposing sides of the operation control channel.

The above OLED display further comprises a passivation layer formed over the interlayer insulating layer, wherein the OLED includes: a pixel electrode formed over the passivation layer; an organic emission layer formed over the pixel electrode; and a common electrode positioned on the organic emission layer.

Another aspect is an organic light-emitting diode (OLED) display, comprising: a scan line; a data line crossing the scan line and configured to receive a driving voltage; and a storage capacitor including first and second storage electrodes, wherein the second storage electrode includes an extension at least partially overlapping the data line in the depth dimension of the OLED display, and wherein the scan line and the extension do not overlap each other in the depth dimension of the OLED display.

The above OLED display further comprises a driving transistor including the first storage electrode configured to function as a driving gate electrode of the driving transistor.

In the above OLED display, a portion of the first storage electrode does not overlap the second storage electrode in the depth dimension of the OLED display.

In the above OLED display, the second storage electrode is polygonal.

In the above OLED display, the second storage electrode has a step shape and includes an upper portion and a lower portion.

In the above OLED display, only the upper portion of the second storage electrode overlaps the driving gate electrode in the depth dimension of the OLED display.

The above OLED display further comprises a switching transistor including a switching drain electrode, wherein the driving transistor further includes a driving source electrode, and wherein the lower portion of the overlaps the switching drain electrode and the drive source electrode in the depth dimension of the OLED display.

The above OLED display further comprises a light emission control line configured to receive a light emission control signal, wherein the light emission control line and the second storage electrode do not overlap in the depth dimension of the OLED display.

According to at least one of the disclosed embodiments, it is possible to minimize the parasitic capacitance from occurring between the data line and the driving gate electrode. Therefore, it is possible to minimize the vertical crosstalk by minimizing the kick back voltage due to the parasitic capacitor to make the change in the driving gate voltage Vg of the driving gate electrode small Further, it is possible to expand the driving range of the driving gate-source voltage Vgs between the driving gate electrode and the driving source electrode by minimizing the kickback voltage due to the parasitic capacitor to increase the data voltage. Therefore, it is possible to increase the resolution of the OLED display and improve the display quality by more elaborately controlling the gray scale of light emitted from the OLED.

DETAILED DESCRIPTION OF CERTAIN INVENTIVE EMBODIMENTS

Figure 1:
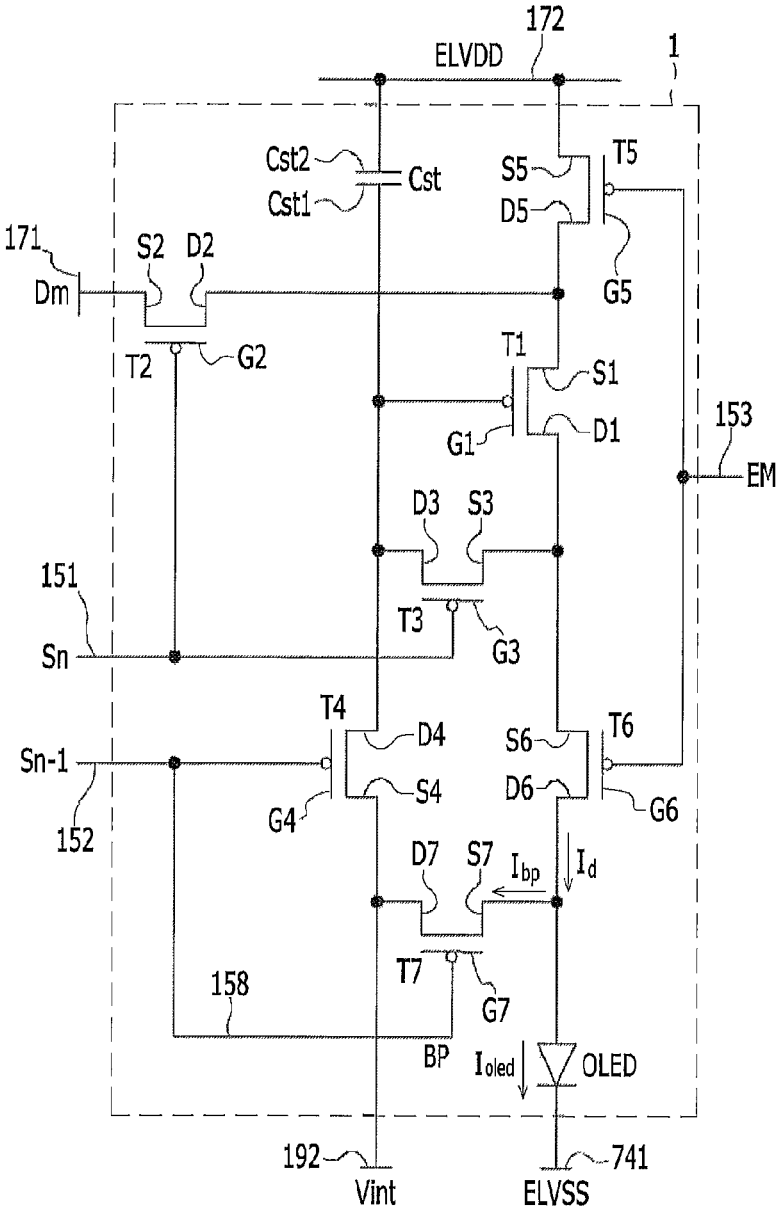
FIG. 1 is an equivalent circuit diagram of one pixel of an OLED display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the described technology is not limited thereto. In the drawings, the thickness of layers, films, panels, regions, etc., are exaggerated for clarity. In the drawings, for understanding and ease of description, the thickness of some layers and areas is exaggerated.

In addition, unless explicitly described to the contrary, the word "comprise" and variations such as "comprises" or "comprising", will be understood to imply the inclusion of stated elements but not the exclusion of any other elements. Further, throughout the present specification, it will be understood that when an element such as a layer, film, region, or substrate is referred to as being "on" another element, it can be directly on the other element or intervening elements can also be present. Further, in the specification, the word "on" or "over" means positioning on or below the object portion, but does not essentially mean positioning on the upper side of the object portion based on a gravity direction.

Further, throughout the specification, the word "on plane" means viewing an object portion from the top and the word "on section" means viewing a section of an object portion, which is vertically taken along, from a side. In this disclosure, the term "substantially" includes the meanings of completely, almost completely or to any significant degree under some applications and in accordance with those skilled in the art. The term "connected" can include an electrical connection.

Further, the number of thin film transistors (TFTs) and capacitors is not limited to the number illustrated in the accompanying drawings and an OLED display can be formed in various structures in which one pixel can include a plurality of transistors and at least one capacitor and is further provided with a separate wiring or does not include the existing wirings. Here, the pixel means a minimum unit which displays an image and the OLED display displays an image through a plurality of pixels.

Hereinafter, an OLED display according to an exemplary embodiment will be described in detail with reference to FIG. 1. FIG. 1 is an equivalent circuit diagram of one pixel of an OLED display according to an exemplary embodiment.

As illustrated in FIG. 1, one pixel 1 of the OLED display according to the exemplary embodiment includes a plurality of signal lines 151, 152, 153, 158, 171, 172, and 192, a plurality of transistors T1, T2, T3, T4, T5, T6, and T7 which are connected to the signal lines 151, 152, 153, 158, 171, 172, and 192, a storage capacitor Cst, and an OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 includes a scan line 151 which transfers a scan signal Sn, a previous scan line 152 which transfers a previous scan signal Sn-1 to the initialization transistor T4, a light emission control line 153 which transfers a light emission control signal EM to the operation control transistor T5 and the light emission control transistor T6, a bypass control layer 158 which transfers a bypass signal BP to the bypass transistor T7, a data line 171 which intersects with the scan line 151 and transfers a data signal Dm, a driving voltage line 172 which transfers a driving voltage ELVDD and is formed in approximately parallel with the data line 171, and an initialization voltage line 192 which transfers an initialization voltage Vint initializing the driving transistor T1.

A gate electrode G1 of the driving transistor T1 is connected to one terminal Cstl of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm depending on a switching operation of the switching transistor T2 to supply a driving current Id to the OLED.

A gate electrode G2 of the switching transistor T2 is connected to the scan line 151, and a source electrode S2 of the switching transistor T2 is connected to the data line 171. A drain electrode D2 of the switching transistor T2 is connected to the driving voltage line 172 via the operation control transistor T5, while being connected to the source electrode S1 of the driving transistor T1. The switching transistor T2 is turned on depending on the scan signal Sn which is transferred through the scan line 151 to perform a switching operation of transferring the data signal Dm transferred to the data line 171 to the source electrode S1 of the driving transistor T1.

A gate electrode G3 of the compensation transistor T3 is connected to the scan line 151, and a source electrode S3 of the compensation transistor T3 is connected to the anode of the OLED via the light emission control transistor T6 while being connected to the drain electrode D1 of the driving transistor T1. A drain electrode D3 of the compensation transistor T3 is connected to a drain electrode D4 of the initialization transistor T4, one terminal Cst1 of the storage capacitor Cst, and the gate electrode G1 of the driving transistor T1 together. The compensation transistor T3 is turned on depending on the scan signal Sn which is transferred through the scan line 151 to connect between the gate electrode G1 and the drain electrode D1 of the driving transistor T1 so as to be diode-connected to the driving transistor T1.

A gate electrode G4 of the initialization transistor T4 is connected to the previous scan line 152, and the source electrode S4 of the initialization transistor T4 is connected to the initialization voltage line 192. The drain electrode D4 of the initialization transistor T4 is connected to one terminal Cst1 of the storage capacitor Cst via the drain electrode D3 of the compensation transistor T3 and the gate electrode G1 of the driving transistor T1 together. The initialization transistor T4 is turned on depending on the previous scan signal Sn-1 which is transferred through the previous scan line 152 to transfer the initialization voltage Vint to the gate electrode G1 of the driving transistor T1 so as to perform the initialization operation which initializes a gate voltage of the gate electrode G1 of the driving transistor T1.

A gate electrode G5 of the operation control transistor T5 is connected to the light emission control line 153, and the source electrode S5 of the operation control transistor T5 is connected to the driving voltage line 172. The drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 153, and a source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to the anode of the OLED. The operation control transistor T5 and the light emission control transistor T6 are substantially simultaneously (or concurrently) turned on depending on the light emission control signal EM which is transferred through the light emission control line 153 and thus the driving voltage ELVDD is compensated by the diode-connected driving transistor T1 and then is transferred to the OLED.

A gate electrode G7 of the bypass transistor T7 is connected to the bypass control line 158, and a source electrode S7 of the bypass transistor T7 is connected to the drain electrode D6 of the light emission control transistor T6 and the anode of the OLED together. A drain electrode D7 of the bypass transistor T7 is connected to the initialization voltage line 192 and the source electrode S4 of the initialization thin film transistor T4 together. Here, the bypass control line 158 is connected to the previous scan line 152 and therefore the bypass signal BP is the same as the previous scan signal Sn-1.

The other terminal Cst2 of the storage capacitor Cst is connected to the driving voltage line 172 and a cathode of the OLED is connected to the common voltage line 741 through which a common voltage ELVSS is transferred.

Meanwhile, the exemplary embodiment describes a 7tr 1 cap (7 transistor, 1 capacitor) structure including the bypass transistor T7 but is not limited thereto, and the number of transistors and the number of capacitors can be variously changed.

Hereinafter, a detailed operation process of one pixel of the OLED display according to the exemplary embodiment will be described in detail with reference to FIG. 2.

Figure 2:
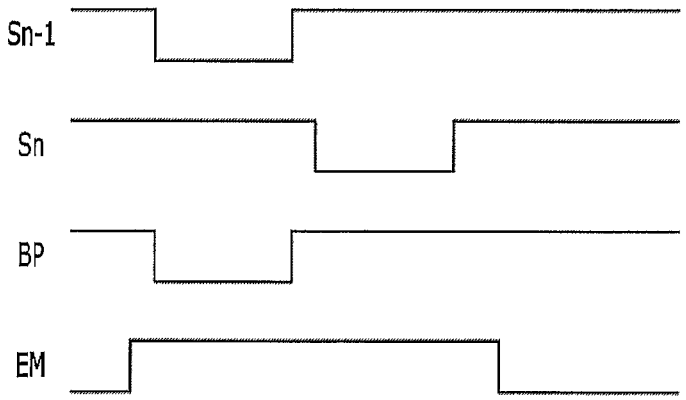
FIG. 2 is a timing diagram of a signal applied to a pixel of the OLED display according to the exemplary embodiment.

FIG. 2 is a timing diagram of a signal applied to a pixel of the OLED display according to the exemplary embodiment.

First, a low-level previous scan signal Sn-1 is supplied through the previous scan line 152 for an initialization period. Next, the initialization transistor T4 is turned on depending on the low-level previous scan signal Sn-1, and the initialization voltage Vint is connected to the gate electrode G1 of the driving transistor T1 from the initialization voltage line 192 through the initialization transistor T4. Then, the driving transistor T1 is initialized by the initialization voltage Vint.

Next, the low-level scan signal Sn is supplied through the scan line 151 for a data programming period Next, the switching transistor T2 and the compensation transistor T3 are turned on depending on the low-level scan signal Sn. In this case, the driving transistor T1 is diodeconnected by the turned-on compensation transistor T3 and is biased forward.

Next, a compensation voltage Dm+Vth (Vth is a negative value), which includes the data signal Dm supplied from the data line 171 added by a threshold voltage (Vth) of the driving transistor T1, is applied to the gate electrode G1 of the driving transistor T1. The driving voltage ELVDD and the compensation voltage Dm+Vth is applied to both terminal of the storage capacitor Cst and a charge corresponding to the difference in voltage between both terminals of the storage capacitor Cst is stored in the storage capacitor Cst.

Next, the light emission control signal EM supplied from the light emission control line 153 is changed from a high level to a low level for an emission period. Next, the operation control transistor T5 and the light emission control transistor T6 are turned on by the low-level light emission control signal EM for the emission period.

Next, a driving current Id corresponding to a voltage difference between the gate voltage Vg of the gate electrode G1 of the driving transistor T1 and the driving voltage ELVDD is generated. And the driving current Id is supplied to the OLED through the light emission control transistor T6. A gate-source voltage Vgs of the driving transistor T1 is maintained at '(Dm+Vth)−ELVDD' by the storage capacitor Cst for the emission period and depending on a current-voltage relationship of the driving transistor T1, the driving current Id is substantially proportional to a square '$(Dm-ELVDD)^2$' of a value obtained by subtracting the threshold voltage from the source-gate voltage. Therefore, the driving current Id is determined independent of the threshold voltage Vth of the driving transistor T1.

In this case, the bypass transistor T7 receives a bypass signal BP from the bypass control line 158. The bypass signal BP is a predetermined level of voltage which can always turn off the bypass transistor T7. And the bypass transistor T7 transfers a voltage having a transistor off level to the gate electrode G7, such that the bypass transistor T7 is always turned off and some of the driving current Id exits to a bypass current Ibp through the bypass transistor T7 in the state in which the bypass transistor T7 is turned off.

When the OLED emits light even though a minimum current of the driving transistor T1 displaying a black image flows as a driving current, the black image is not properly displayed. Therefore, the bypass transistor T7 of the OLED display according to the exemplary embodiment can disperse some of the minimum current of the driving transistor T1 to current paths other than a current path to the OLED as the bypass current Ibp. Here, the minimum current of the driving transistor T1 means a current under the condition that the gate-source voltage Vgs of the driving transistor T1 is less than the threshold voltage Vth and thus the driving transistor T1 is turned off. The minimum driving current (e.g., current which is equal to or less than about 10 pA) under the condition that the driving transistor T1 is turned off is transferred to the OLED and is represented by an image of black luminance. When the minimum driving current representing the black image flows, the effect of the bypass transfer of the bypass current Ibp is large but when a large driving current representing an image like a general image or a white image flows, an effect of the bypass current Ibp can be less. Therefore, when the driving current representing the black image flows, a light emitting current holed of the OLED which is reduced as much as a current amount of the bypass current Ibp which exits from the driving current Id through the bypass transistor T7 has a minimum current amount so as to certainly represent the black image. Therefore, the accurate black luminance image is achieved by using the bypass transistor T7 to improve a contrast ratio. In FIG. 2, the bypass signal BP is the same as the previous scan signal Sn-1, but is not necessarily limited thereto.

Hereinafter, the detailed structure of the OLED display according to the exemplary embodiment to which the structure is applied will be described in detail with reference to FIGS. 3 to 6.

Figure 3:
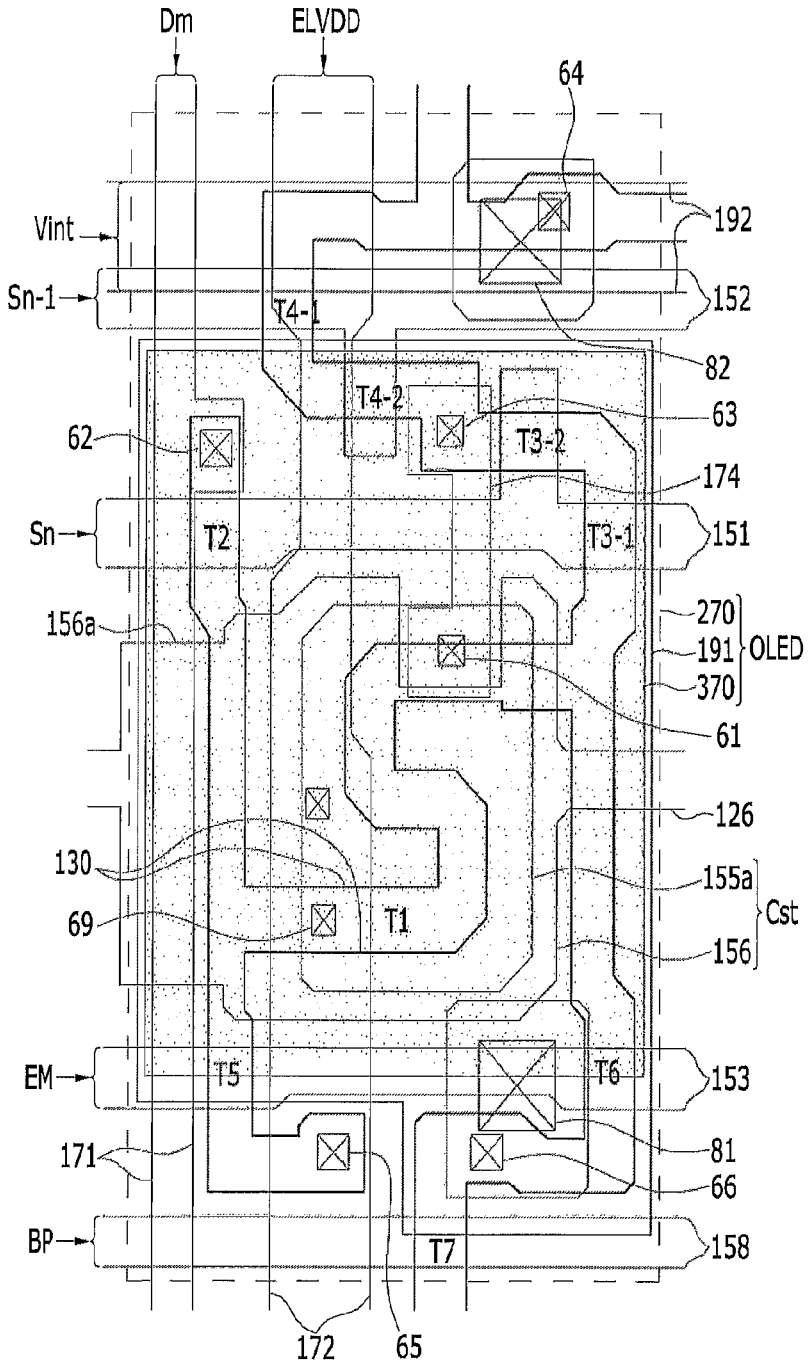
FIG. 3 is a diagram schematically illustrating a plurality of transistors and a capacitor of an OLED display according to an exemplary embodiment.
Figure 4:
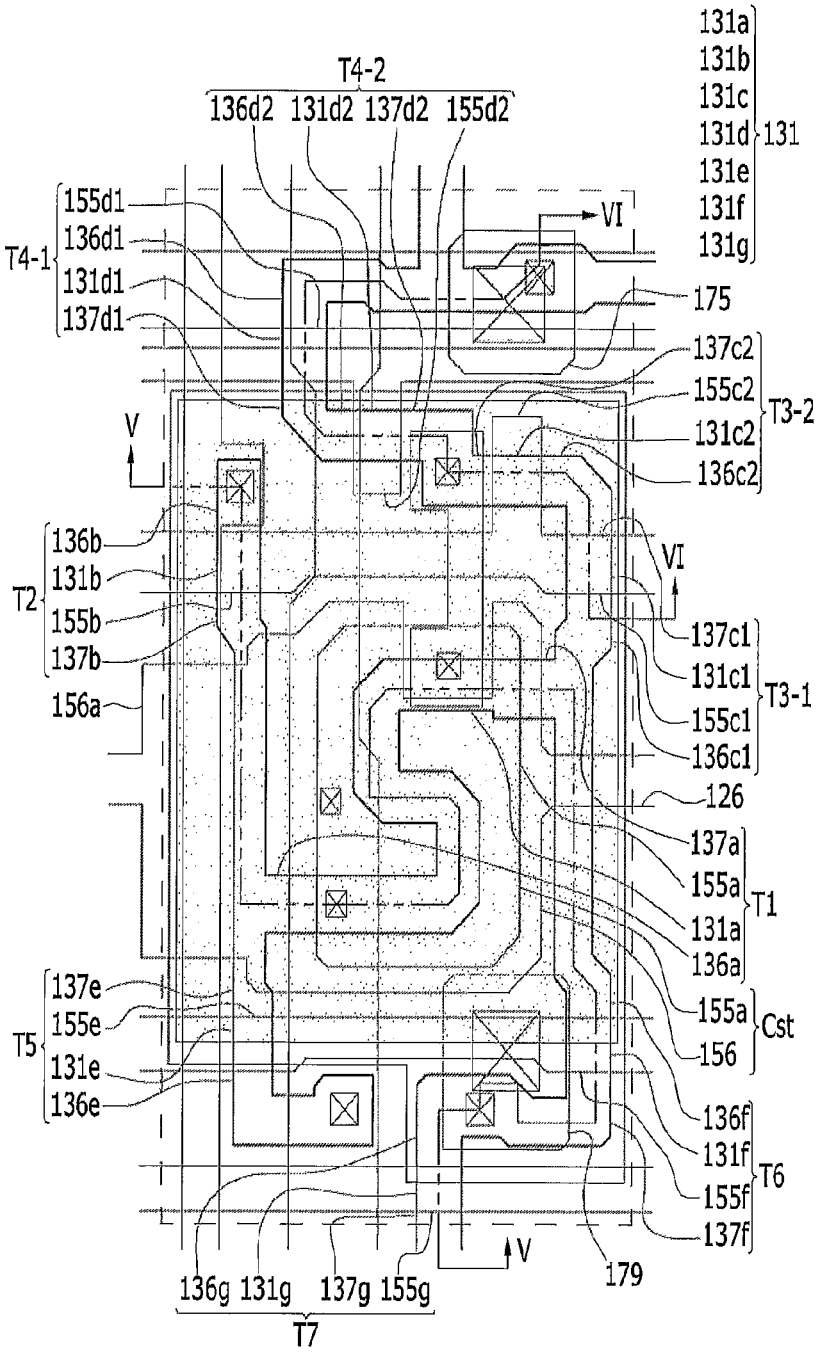
FIG. 4 is a detailed layout view of FIG. 3.
Figure 5:
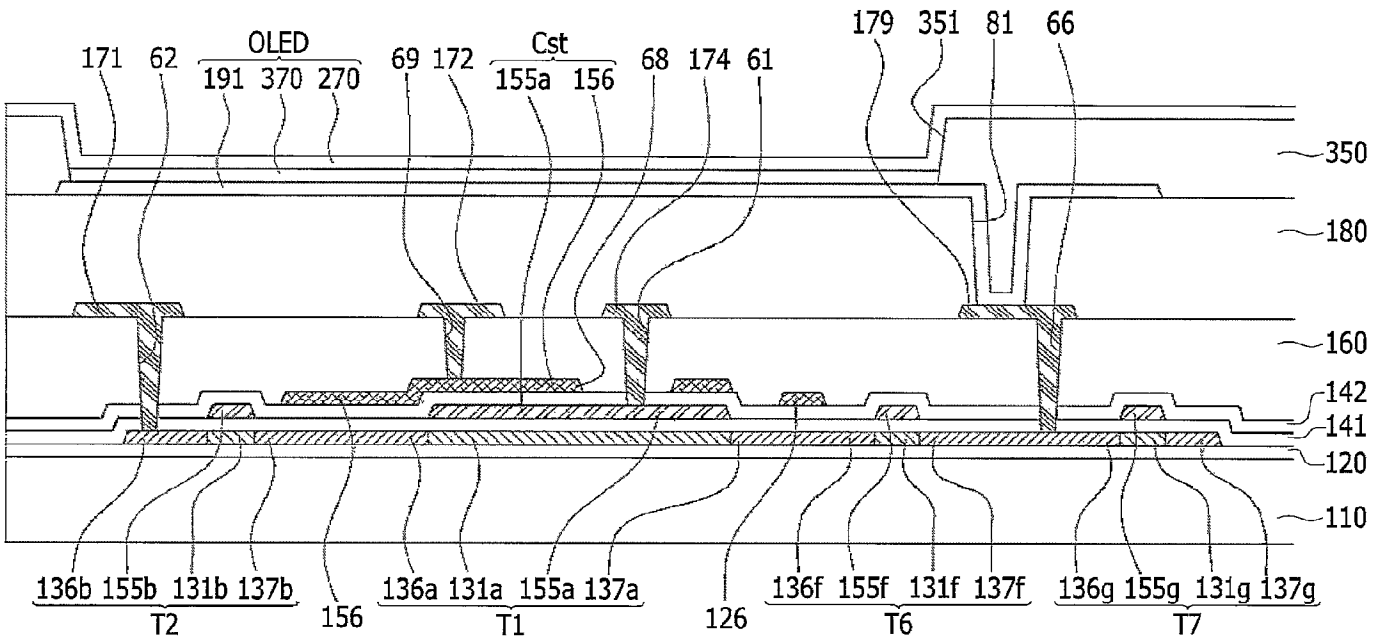
FIG. 5 is a cross-sectional view of the OLED display of FIG. 4 taken along the line V-V.
Figure 6:
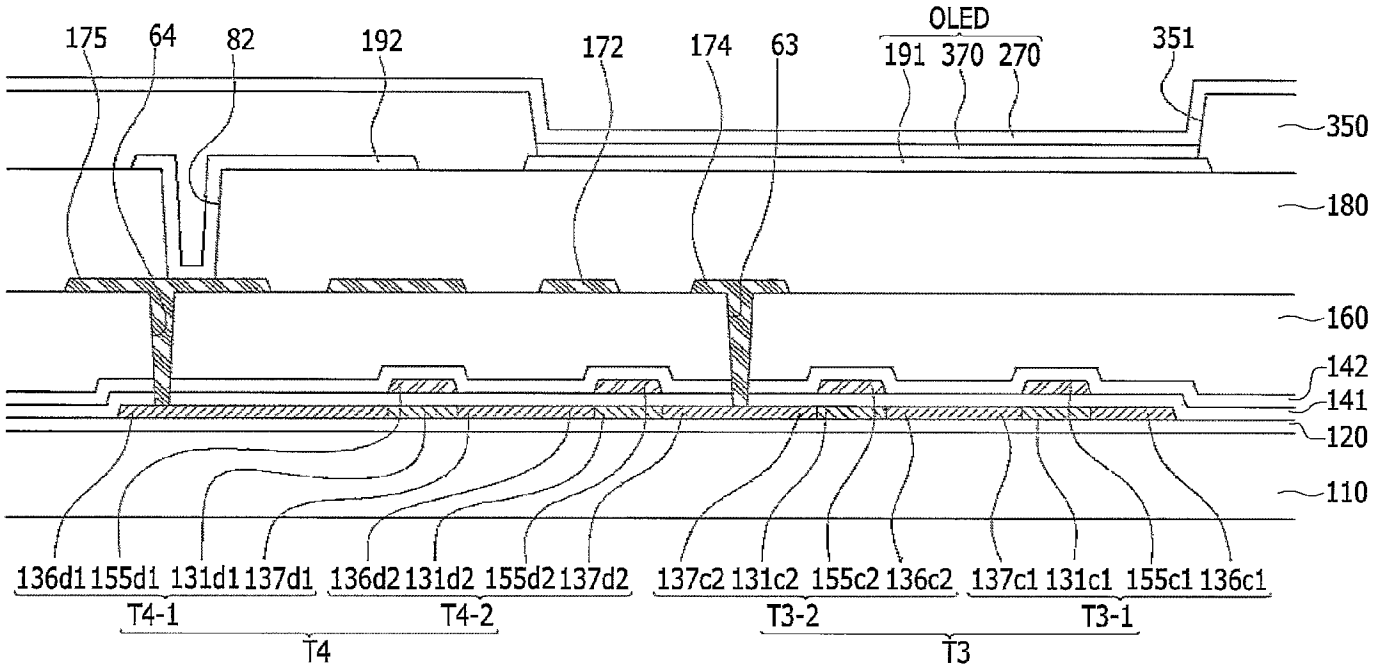
FIG. 6 is a cross-sectional view of the OLED display of FIG. 4 taken along the line VI-VI.

FIG. 3 is a diagram schematically illustrating a plurality of transistors and a capacitor of an OLED display according to an exemplary embodiment. FIG. 4 is a detailed layout view of one pixel of FIG. 3. FIG. 5 is a cross-sectional view of the OLED display of FIG. 4 taken along the line V-V. FIG. 6 is a cross-sectional view of the OLED display of FIG. 4 taken along the line VI-VI.

Hereinafter, a detailed plane structure of the OLED display according to the exemplary embodiment will first be described with reference to FIGS. 3 and 4 and a detailed cross section structure thereof will be described with reference to FIGS. 5 and 6.

First, as illustrated in FIG. 3, the OLED display according to the exemplary embodiment applies the scan signal Sn, the previous scan signal Sn-1, the light emission control signal EM, and the bypass signal BP, respectively, and includes the scan line 151, the previous scan line 152, and the light emission control line 153, and the bypass control line 158 which are formed along a row direction. Further, the pixel unit P1 includes the data line 171 and the driving voltage line 172 which intersect with the scan line 151, the previous scan line 152, the light emission control line 153, and the bypass control line 158 and applies the data signal Dm and the driving voltage ELVDD to the pixel 1, respectively. The initialization voltage Vint is transferred from the initialization voltage line 192 to the compensation transistor T3 via the initialization transistor T4.

Further, the pixel 1 is provided with the driving transistor T1, the switching transistor T2, the compensation transistor T3, the initialization transistor T4, the operation control transistor T5, the light emission control transistor T6, the bypass transistor T7, the storage capacitor Cst, and the OLED. The OLED includes a pixel electrode 191, an organic emission layer 370, and a common electrode 270. In this case, the compensation transistor T3 and the initialization transistor T4 are configured of a transistor having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor layer 130 which can be curved in various shapes. The semiconductor layer 130 can be formed of a polycrystalline semiconductor material or an oxide semiconductor material. The oxide semiconductor can include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and an indium-gallium-zinc oxide ($InGaZnO_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In Ge Sn O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the semiconductor layer 130 is formed of the oxide semiconductor, a separate protective layer can be added to protect the oxide semiconductor material which is vulnerable to external environments, such as high temperature.

The semiconductor layer 130 includes a channel which is channel-doped with N-type impurity or P-type impurity. A source doping region and a drain doping region are formed at both sides of the channel and have a doping concentration higher than that of the doping impurity which is doped in the channel. According to the exemplary embodiment of the exemplary embodiment, the source doping region and the drain doping region each correspond to the source electrode and the drain electrode. The source electrode and the drain electrode which are formed in the semiconductor layer 130 can be formed by doping only the corresponding region. Further, the region between the source electrodes and the drain electrodes of different transistors in the semiconductor layer 130 is doped, and thus the source electrodes can be electrically connected to the drain electrodes.

As illustrated in FIG. 4, a channel 131 includes a driving channel 131a which is formed in the driving transistor T1, a switching channel 131b which is formed in the switching transistor T2, a compensation channel 131c which is formed in the compensation transistor T3, an initialization channel 131d which is formed in the initialization transistor T4, an operation control channel 131e which is formed in the operation control transistor T5, a light emission control channel 131f which is formed in the light emission control transistor T6, and a bypass channel 131g which is formed in the bypass transistor T7.

The driving transistor T1 includes the driving channel 131a, a driving gate electrode 155a, a driving source electrode 136a, and a driving drain electrode 137a. The driving channel 131a can be curved and can have a meandering shape or a zigzag shape. As such, as the driving channel 131a having the bent shape is provided and thus the driving channel 131a formed long within the narrow space can be provided. Therefore, the driving range of the gate voltage Vgs applied to the driving gate electrode 155a is widened by the long formed driving channel 131a. Since the driving range of the gate voltage Vg is wide, it is possible to control more delicately gray scale of light emitted from the OLED by changing a magnitude of the gate voltage Vg, thereby increasing a resolution of the OLED display and improving a display quality. The shape of the driving channel 131a is variously changed and thus various exemplary embodiments such as 'reverse S', 'S', 'M', 'W', and the like can be possible.

The driving gate electrode 155a overlaps the driving channel 131a and the driving source electrode 136a and the driving drain electrode 137a are each formed at both sides of the driving channel 131a, while being adjacent to each other. The driving gate electrode 155a is connected to a first data connecting member 174 through a contact hole 61.

The switching transistor T2 includes a switching channel 131b, a switching gate electrode 155b, a switching source electrode 136b, and a switching drain electrode 137b. The switching gate electrode 155b which is some of the portion extending downward from the scan line 151 overlaps the switching channel 131b and the switching source electrode 136b and the switching drain electrode 137b are each formed at both sides of the switching channel 131b, while being adjacent to each other. The switching source electrode 136b is connected to the data line 171 through a contact hole 62.

The compensation transistor T2 is formed in two to prevent a leakage current and includes a first compensation transistor T3-1 and a second compensation transistor T3-2 which are adjacent to each other. The first compensation transistor T3-1 is positioned around the scan line 151 and the second compensation transistor T3-2 is positioned around a protrusion of the scan line 151. The first compensation transistor T3-1 includes a first compensation channel 131c1, a first compensation gate electrode 155c1, a first compensation source electrode 136c1, and a first compensation drain electrode 137c1 and the second compensation transistor T3-2 includes a second compensation channel 131c2, a second compensation gate electrode 155c2, a second compensation source electrode 136c2, and a second compensation drain electrode 137c2.

The first compensation gate electrode 155c1 which is a portion of the scan line 151 overlaps with the first compensation channel 131c1 and the first compensation source electrode 136c1 and the first compensation drain electrode 137c1 are each formed to be adjacent to both sides of the first compensation channel 131c1. The first compensation source electrode 136c1 is connected to the light emission control source electrode 136f and the driving drain electrode 137a, and the first compensation drain electrode 137c1 is connected to the second compensation source electrode 136c2.

The second compensation gate electrode 155c2 which is a protrusion protruding upward from the scan line 151 overlaps with the second compensation channel 131c2. The second compensation source electrode 136c2 and the second compensation drain electrode 137c2 are each formed to be adjacent to both sides of the second compensation channel 131c2. The second compensation drain electrode 137c2 is connected to a first data connecting member 174 through a contact hole 63.

The initialization transistor T4 is formed in two to prevent a leakage current and includes a first initialization transistor T4-1 and a second initialization transistor T4-2 which are adjacent to each other. The first initialization transistor T4-1 is positioned around the previous scan line 152. The second initialization transistor T4-2 is positioned around the protrusion of the previous scan line 152. The first initialization transistor T4-1 includes a first initialization channel 131d1, a first initialization gate electrode 155d1, a first initialization source electrode 136d1, and a first initialization drain electrode 137d1. The second initialization transistor T4-2 includes a second initialization channel 131d2, a second initialization gate electrode 155d2, a second initialization source electrode 136d2, and a second initialization drain electrode 137d2.

The first initialization gate electrode 155d1, which is a portion of the previous scan line 152, overlaps with the first initialization channel 131d1 and is formed to be adjacent to both sides of the first initialization channel 131d1. The first initialization source electrode 136d1 is connected to the second data connecting member 175 through a contact hole 64. The first initialization drain electrode 137d1 is connected to the second initialization source electrode 136d2.

The second initialization gate electrode 155d2, which is a protrusion protruding downward from the previous scan line 152, overlaps the second initialization channel 131d2. The second initialization source electrode 136d2 and the second initialization drain electrode 137d2 are each formed to be adjacent to both sides of the second initialization channel 131d2. The second initialization drain electrode 137d2 is connected to a first data connecting member 174 through a contact hole 63.

As such, the compensation transistor T3 is formed in two including the first compensation transistor T3-1 and the second compensation transistor T3-2. The initialization transistor T4 is formed in two including the first initialization transistor T4-1 and the second initialization transistor T4-2 to cut off an electron moving path of the channels 131c1, 131c2, 131d1, and 131d2 in an off state, thereby effectively preventing the leakage current from occurring.

The operation control transistor T5 includes an operation control channel 131e, an operation control gate electrode 155e, an operation control source electrode 136e, and an operation control drain electrode 137e. The operation control gate electrode 155e, which is a portion of the light emission control line 153, overlaps the operation control channel 131e. The operation control source electrode 136e and the operation control drain electrode 137e are each formed at both sides of the operation control channel 131e while being adjacent to each other. The operation control source electrode 136e is connected to a portion of the driving voltage line 172 through a contact hole 65.

The light emission control transistor T6 includes a light emission control channel 131f, a light emission control gate electrode 155f, a light emission control source electrode 136f, and a light emission control drain electrode 137f. The light emission control gate electrode 155f, which is a portion of the light emission control line 153, overlaps the light emission control channel 131f. The light emission control source electrode 136f and the light emission control drain electrode 137f are each formed at both sides of the light emission control channel 131f while being adjacent to each other. The light emission control drain electrode 137f is connected to a third data connecting member 179 through a contact hole 66.

The bypass thin film transistor T7 includes a bypass channel 131g, a bypass gate electrode 155g, a bypass source electrode 136g, and a bypass drain electrode 137g. The bypass gate electrode 155g, which is a portion of the bypass control line 158, overlaps the bypass channel 131g. The bypass source electrode 136g and the bypass drain electrode 137g are each formed at both sides of the bypass channel 131g, while being adjacent to each other. The bypass source electrode 136g is connected to the third data connecting member 179 through a contact hole 81, and the bypass drain electrode 137g is directly connected to the first initialization source electrode 136d1.

One end of the driving channel 131a of the driving transistor T1 is connected to the switching drain electrode 137b and the operation control drain electrode 137e. And the other end of the driving channel 131a is connected to the compensation source electrode 136c and the light emission control source electrode 136f.

The storage capacitor Cst includes the first storage electrode 155a and the second storage electrode 156, and the second gate insulating layer 142 formed therebetween. The first storage electrode 155a corresponds to the driving gate electrode 155a.

The second storage electrode 156 is an extended portion in a data line extending direction from the storage line 126 and occupies the wider area than the driving gate electrode 155a and completely covers the driving gate electrode 155a.

For example, according to the exemplary embodiment, the second storage electrode 156 includes an extension 156a extending in the extending direction of the scan line 151 to overlap with the data line 171. That is, a portion of the data line 171 overlaps the extension of the second storage electrode 156.

In the viewpoint of the length direction of the data line, the width of the area in which the extension 156a overlaps the data line 171 can be less than that of the area in which the first storage electrode 155a overlaps with the second storage electrode 156. That is, the width of the extension 156a can be less than that of the second storage electrode 156 which overlaps the first storage electrode 155a.

Meanwhile, the parasitic capacitor Ca occurs between the data line 171 and the scan line 151, and the parasitic capacitor Ca changes the driving gate voltage Vg of the driving gate electrode 155a to affect luminance, thereby generating the vertical crosstalk.

However, according to the exemplary embodiment, the extension 156a connected to the driving voltage line 172 to which the driving voltage ELVDD is applied and overlapping with the data line 171 is positioned between the data line 171 and the scan line 151. Therefore, the extension 156a to which the driving voltage is transferred is formed between the scan line 151 and the data line 171 to minimize the parasitic capacitor between the scan line 151 and the data line 171.

It is possible to control the vertical crosstalk by minimizing the kick back voltage due to the parasitic capacitor to minimize the change in the driving gate voltage Vg of the driving gate electrode 155a.

Further, it is possible to expand the driving range of the driving gate-source voltage Vgs between the driving gate electrode 155a and the driving source electrode 136a by minimizing the kickback voltage due to the parasitic capacitor to increase the data voltage Dm. Therefore, it is possible to increase the resolution of the OLED display and improve the display quality by more elaborately controlling the gray scale of light emitted from the OLED.

Here, the second gate insulating layer 142 is a dielectric material, and storage capacitance is determined by a charge charged in the storage capacitor Cst and a voltage between both electrodes 155a and 156. As such, the driving gate electrode 155a is used as the first storage electrode 155a, and thus a space in which the storage capacitor can be formed can be secured in a narrowing space due to the driving channel 131a occupying a large area within the pixel.

The first storage electrode 155a which is the driving gate electrode 155a is connected to one end of the first data connecting member 174 through the contact hole 61 and the storage opening 68. The storage opening 68 is an opening which is formed in the second storage electrode 156. The first data connecting member 174 is formed on the same layer to be substantially parallel with the data line 171. The other end of the first data connecting member 174 is connected to the second compensation drain electrode 137c2 and the second initialization drain electrode 137d2 through the contact hole 63. Therefore, the first data connecting member 174 connects the driving gate electrode 155a to the second compensation drain electrode 137c2 of the second compensation transistor T3-2 and the second initialization drain electrode 137d2 of the second initialization transistor T4-2.

The second storage electrode 156 is connected to the driving voltage line 172 through a contact hole 69. Therefore, the storage capacitor Cst stores the storage capacitance corresponding to the difference between the driving voltage ELVDD, transferred to the second storage electrode 156 through the driving voltage line 172, and the gate voltage Vg of the driving gate electrode 155a.

The third data connecting member 179 is connected to the pixel electrode 191 through a contact hole 81 and the second data connecting member 175 is connected to the initialization voltage line 192 through a contact hole 82.

Hereinafter, the section structure of the OLED display according to the exemplary embodiment will be described in detail according to the stacked structure with reference to FIGS. 5 and 6. In this case, the operation control transistor T5 is substantially the same as the stacked structure of the light emission control transistor T6 and therefore a detailed description thereof will be omitted.

A buffer layer 120 is formed on the substrate 120. The substrate 110 can be formed of an insulating substrate formed of glass, quartz, ceramic, plastic, and the like. The buffer layer 120 can block impurities from the substrate 110 at the time of a crystallization process for forming polycrystalline semiconductor to serve to improve characteristics of the polycrystalline semiconductor and reduce a stress applied to the substrate 110.

The semiconductor layer 130 which includes the driving channel 131a, the switching channel 131b, the compensation channel 131c, the initialization channel 131d, the operation control channel 131e, the light emission control channel 131f, and the bypass channel 131g is formed on the buffer layer 120. The driving source electrode 136a and the driving drain electrode 137a are formed at both sides of the driving channel 131a among the semiconductor layer 130. The switching source electrode 136b and the switching drain electrode 137b are formed at both sides of the switching channel 131b. Further, the first compensation source electrode 136c1 and the first compensation drain electrode 137c1 are formed at both sides of the first compensation channel 131c1. The second compensation source electrode 136c2 and the second compensation drain electrode 137c2 are formed at both sides of the second compensation channel 131c2. The first initialization source electrode 136d1 and the first initialization drain electrode 137d1 are formed at both sides of the first initialization channel 131d1. The second initialization source electrode 136d2 and the second initialization drain electrode 137d2 are formed at both sides of the second initialization channel 131d2. Further, the operation control source electrode 136e and the operation control drain electrode 137e are formed at both sides of the operation control channel 131e. The light emission control source electrode 136f and the light emission control drain electrode 137f are formed at both sides of the light emission control channel 131f. Further, the bypass source electrode 136g and the bypass drain electrode 137g are formed at both sides of the bypass channel 131g.

The first gate insulating layer 141 is formed on the semiconductor layer 130 to cover the semiconductor layer 130. The scan line 151 includes the switching gate electrode 155b, the first compensation gate electrode 155c1, and the second compensation gate electrode 155c2. The previous scan line 152 includes the first initialization gate electrode 155d1 and the second initialization gate electrode 155d2. The light emission control line 153 includes the operation control gate electrode 155e and the light emission control gate electrode 155f. The bypass control line 158 includes the bypass gate electrode 155g. The first gate wirings 151, 152, 153, 158, 155a, 155b, 155c1, 155c2, 155d1, 155d2, 155e, 155g, and 155f including the driving gate electrode 155a (first storage electrode) are positioned on the first gate insulating layer 141.

The second gate insulating layer 142 is positioned on the first gate wirings 151, 152, 153, 158, 155a, 155b, 155c1, 155c2, 155d1, 155d2, 155e, and 155f and the first gate insulating layer 141 to cover the first gate wirings 151, 152, 153, 158, 155a, 155b, 155c1, 155c2, 155d1, 155d2, 155e, and 155f and the first gate insulating layer 141. The first gate insulating layer 141 and the second gate insulating layer 142 can be formed of silicon nitride (SiNx), silicon oxide $SiO_2$, or the like.

The storage line 126 which is formed substantially in parallel with the scan line 151. The second gate wirings 126 and 156 including the second storage electrode 156, which extends from the storage line 154 to overlap with the data line, are formed on the second gate insulating layer 142.

An interlayer insulating layer 160 is positioned on the second gate insulating layer 142 and the second gate wirings 126 and 156. A material of the interlayer insulating layer 160 can be silicon nitride (SiNx), silicon oxide $SiO_2$, or the like.

The contact holes 61, 62, 63, 64, 65, 66, and 69 are formed on the interlayer insulating layer 160. The data wirings 171, 172, 174, 175, and 179 which include the data line 171, the driving voltage line 172, the first data connecting member 174, the second data connecting member 175, and the third data connecting member 179 are positioned on the interlayer insulating layer 160.

The data line 171 is connected to the switching source electrode 136b through the contact hole 62 which is formed on the first gate insulating layer 141, the second gate insulating layer 142, and the interlayer insulating layer 160. One end of the first data connecting member 174 is connected to the first storage electrode 155a through the contact hole 61 which is formed on the second gate insulating layer 142 and the interlayer insulating layer 160. The other end of the first data connecting member 174 is connected to the second compensation drain electrode 137c2 and the second initialization drain electrode 137d2 through the contact hole 63 which is formed on the first gate insulating layer 141, the second gate insulating layer 142, and the interlayer insulating layer 160.

Further, the substantially quadrangular second data connecting member 175 is connected to the first initialization source electrode 136d1 through the contact hole 64 which is formed on the first gate insulating layer 141, the second gate insulating layer 142, and the interlayer insulating layer 160. Further, the substantially quadrangular third data connecting member 179 is connected to the light emission control drain electrode 137f through the contact hole 66 which is formed on the first gate insulating layer 141, the second gate insulating layer 142, and the interlayer insulating layer 160.

A passivation layer 180 is formed on the data wirings 171, 172, 174, 175, and 179 and the interlayer insulating layer 160 to cover the data wirings 171, 172, 174, 175, and 179 and the interlayer insulating layer 160. The passivation layer 180 can be an organic layer.

The pixel electrode 191 and an initialization voltage line 192 are formed on the passivation layer 180. The third data connecting member 179 is connected to the pixel electrode 191 through the contact hole 81 which is formed on the passivation layer 180. The second data connecting member 175 is connected to the initialization voltage line 192 through the contact hole 82 which is formed on the passivation layer 180.

A pixel defined layer (PDL) 350 is formed on the passivation layer 180, the initialization voltage line 192, and an edge of the pixel electrode 191 to cover the passivation layer 180, the initialization voltage line 192, and the edge of the pixel electrode 191. The pixel defined layer 350 has a pixel opening 351 through which the pixel electrode 191 is exposed. The pixel defined layer 350 can be formed of resin such as polyacrylates and polyimides, silica-based inorganic materials, and the like.

An organic emission layer 370 is positioned on the pixel electrode 191 exposed through the pixel opening 351 and the common electrode 270 is positioned on the organic emission layer 370. The common electrode 270 is also formed on the pixel defined layer 350 and thus is formed over the pixels. Thereby, the OLED including the pixel electrode 191, the organic emission layer 370, and the common electrode 270 is formed.

Here, the pixel electrode 191 is an anode which is a hole injection electrode and the common electrode 270 is a cathode which is an electron injection electrode. However, the exemplary embodiment is not necessarily limited thereto and depending on a driving method of the OLED display, the pixel electrode 191 can be the cathode and the common electrode 270 can be the anode. Holes and electrons are each injected from the pixel electrode 191 and the common electrode 270 into the organic emission layer 370. Light is emitted when excitons which is a combination of the injected holes and electrons falls from an excited state to a ground state The organic emission layer 370 can be formed of a low molecular organic material or a high molecular organic material such as poly 3,4-ethylenedioxythiophene (PEDOT), or the like. Further, the organic emission layer 370 is formed of a multilayer which includes at least one of a light emitting layer, a hole injection layer (HIL), a hole transporting layer (HTL), an electron transporting layer (ETL), and an electron-injection layer (EIL). When including them, the hole injection layer is formed on the pixel electrode 191 which is an anode and the hole transporting layer, the light emitting layer, the electron transporting layer, and the electron injection layer are sequentially stacked thereon.

The organic emission layer 370 can include a red organic emission layer which emits red light, a green organic emission layer which emits green light, and a blue organic emission layer which emits blue light. The red organic emission layer, the green organic emission layer, and the blue organic emission layer are each formed in a red pixel, a green pixel, and a blue pixel to implement a color image.

Further, the organic emission layer 370 can implement the color image by stacking the red organic emission layer, the green organic emission layer, and the blue organic emission layer in all of the red pixel, the green pixel, and the blue pixel and by forming a red color filter, a green color filter, and a blue color filter for each pixel. As another example, the color image is implemented by forming a white organic emission layer which emits white light in all of the red pixel, the green pixel, and the blue pixel and by forming the red color filter, the green color filter, and the blue color filter for each pixel. At the time of implementing the color image using the white organic emission layer and the color filters, there is no need to use a deposition mask for depositing the red organic emission layer, the green organic emission layer, and the blue organic emission layer on each pixel, that is, the red pixel, the green pixel, and the blue pixel.

The white organic emission layer described in another example can be formed of a single organic emission layer and can be configured to emit white light by stacking the organic emission layers. For example, the white organic emission layer includes a configuration to emit white light by combining at least one yellow organic emission layer with at least one blue organic emission layer, a configuration to emit white light by combining at least one cyan organic emission layer with at least one red organic emission layer, and a configuration to emit white light by combining at least one magenta organic emission layer with at least one green organic emission layer, and the like.

An encapsulation member (not illustrated) protecting the OLED can be positioned on the common electrode 270. The encapsulation member can encapsulate the substrate 110 by a sealant. The encapsulation member can be formed of various materials such as glass, quartz, ceramic, plastic, and metal. Meanwhile, an organic layer and inorganic layer can be deposited on the common electrode 270 without the sealant to form a thin film encapsulation layer.

Figure 7:
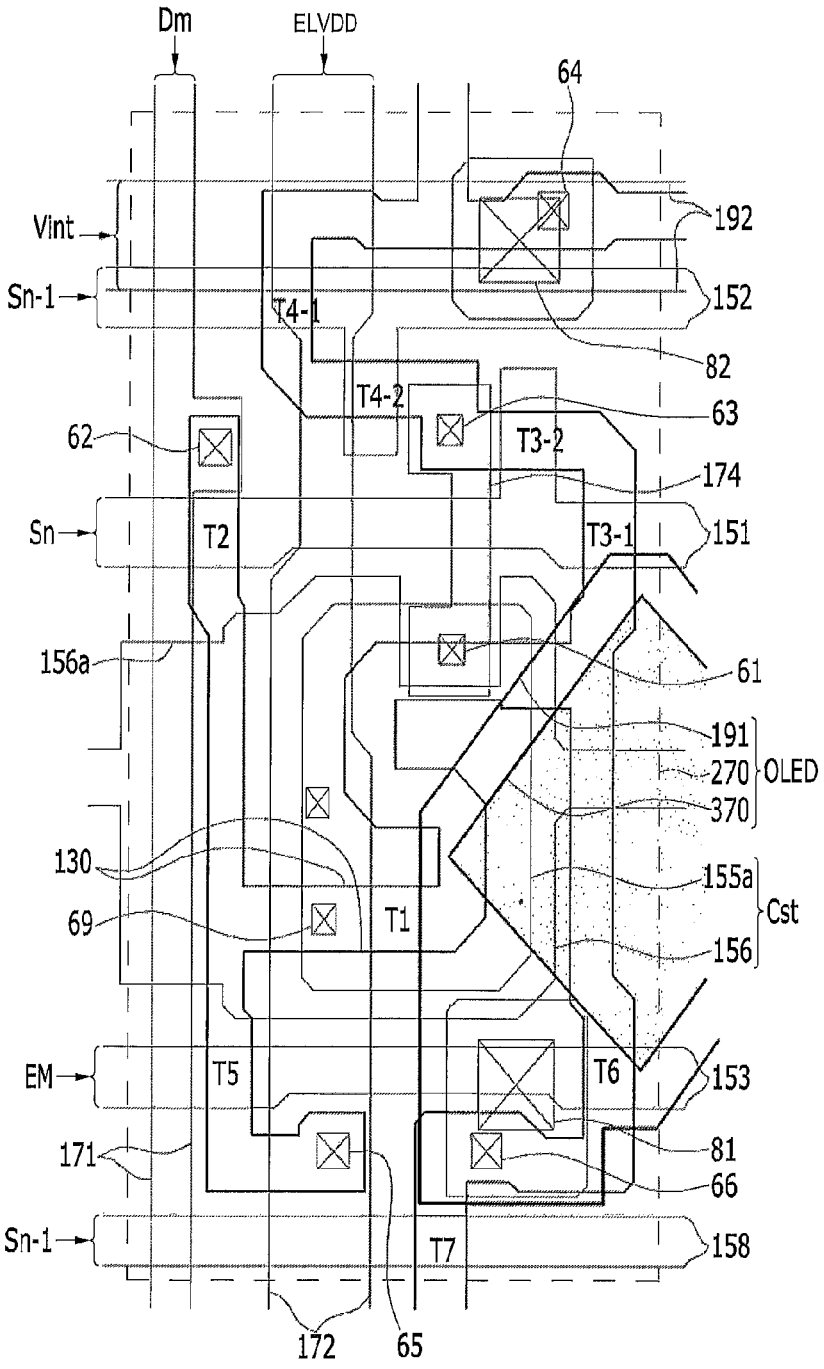
FIG. 7 is a diagram schematically illustrating a plurality of transistors and a capacitor of an OLED display according to another exemplary embodiment.

Hereinafter, the OLED display according to another exemplary embodiment will be described with reference to FIG. 7. FIG. 7 is a diagram schematically illustrating a plurality of transistors and a capacitor of an OLED display according to another exemplary embodiment and the same components as the foregoing exemplary embodiments will be omitted.

Another exemplary embodiment illustrated in FIG. 7 is substantially the same as the exemplary embodiment and as illustrated in FIG. 7, is different from the exemplary embodiment in that the arrangement structure of the pixel electrode and the organic emission layers 191 and 370 is a PenTile matrix structure.

In the arrangement structure of the PenTile matrix pixel, a red subpixel and a blue subpixel can be alternately positioned in the same column and a green subpixel can be positioned in adjacent columns. By the arrangement structure of the PenTile matrix pixel, the high-resolution expression ability can be improved and, in some embodiments, a vertical stripe pattern is not displayed by a specific pixel to improve the image quality.

Hereinafter, the change degree of luminance of the OLED display according to the exemplary embodiment will be described with reference to Table 1.

TABLE 1

| | Exemplary Embodiment | Comparative Example |
|---|---|---|
| Measured value | 0.66% | 1.50% |
| Simulation value | 0.68% | 1.48% |

Referring to FIG. 1, Exemplary Embodiment and Comparative Example are results of the change in luminance due to the effect of the driving gate electrode of the driving transistor when the voltage of the data line for one pixel is changed.

According to the exemplary embodiment, the second storage electrode is positioned to overlap with the data line and the change in luminance of about 0.66% to about 0.68% occurs when the parasitic capacitor between the data line and the scan line is blocked.

On the other hand, in the Comparative Example, when the second storage electrode does not overlap the data line and thus the parasitic capacitor is not blocked, the change in luminance of about 1.48% to 1.50%.

Like the exemplary embodiment, when the second storage electrode overlaps with the data line to block the parasitic capacitor, the change degree in luminance is reduced to about a half, as compared with Comparative Example.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

[1. An organic light-emitting diode (OLED) display, comprising:

a substrate;

a scan line formed over the substrate;

a data line formed over the substrate;

a driving voltage line configured to receive a driving voltage, wherein the data line and driving voltage line cross the scan line and are electrically insulated from the scan line;

a switching transistor electrically connected to the scan line and the data line and including a switching drain electrode;

a driving transistor including a driving source electrode electrically connected to the switching drain electrode and a driving gate electrode including a first storage electrode;

a storage line including a second storage electrode overlapping the first storage electrode in the depth dimension of the OLED display; and an OLED configured to receive the driving voltage from the driving transistor, wherein the second storage electrode includes an extension at least partially overlapping the data line in the depth dimension of the OLED display, and wherein a length of the extension overlapping the data line and a length of the first storage electrode overlapping the second storage electrode are substantially the same.]

[2. The OLED display of claim 1, wherein the extension includes an extended portion of the storage line which extends in a length direction of the data line.]

[3. The OLED display of claim 1, wherein the second storage electrode has an area greater than that of the first storage electrode.]

[4. The OLED display of claim 1, wherein the second storage electrode is electrically connected to the driving voltage line.]

[5. The OLED display of claim 1, further comprising:

a semiconductor layer formed over the substrate and including a switching channel of the switching transistor and a driving channel of the driving transistor; and a first gate insulating layer formed over the semiconductor layer.]

[6. The OLED display of claim 5, wherein the driving channel is non-linear.]

[7. The OLED display of claim 5, further comprising a second gate insulating layer formed over the first storage electrode, wherein the first storage electrode is formed over the first gate insulating layer.]

[8. The OLED display of claim 7, wherein the second storage electrode is formed over the second gate insulating layer, and wherein the first and second storage electrode form a storage capacitor.]

[9. The OLED display of claim 8, further comprising an interlayer insulating layer formed over the second storage electrode, wherein the data line and the driving voltage line are formed over the interlayer insulating layer.]

[10. The OLED display of claim 1, further comprising:

a light emission control line extending substantially in parallel with the scan line and configured to transfer a light emission control signal; and an operation control transistor configured to be turned on based on the light emission control signal and transfer the driving voltage to the driving transistor.]

[11. The OLED display of claim 10, wherein the operation control transistor includes:

the light emission control line configured to function as an operation control gate electrode of the operation control transistor;

an operation control channel overlapping the operation control gate electrode in the depth dimension of the OLED display and formed over the semiconductor layer; and an operation control source and drain electrodes formed over the semiconductor layer and each located at opposing sides of the operation control channel.]

[12. The OLED display of claim 9, further comprising a passivation layer formed over the interlayer insulating layer, wherein the OLED includes:

a pixel electrode formed over the passivation layer;

an organic emission layer formed over the pixel electrode; and a common electrode positioned on the organic emission layer.]

[13. An organic light-emitting diode (OLED) display, comprising:

a scan line;

a data line crossing the scan line and configured to receive a driving voltage; and a storage capacitor including first and second storage electrodes, wherein the second storage electrode includes an extension at least partially overlapping the data line in the depth dimension of the OLED display, and wherein the scan line and the extension do not overlap each other in the depth dimension of the OLED display.]

[14. The OLED display of claim 13, further comprising a driving transistor including the first storage electrode configured to function as a driving gate electrode of the driving transistor.]

[15. The OLED display of claim 14, wherein a portion of the first storage electrode does not overlap the second storage electrode in the depth dimension of the OLED display.]

[16. The OLED display of claim 15, wherein the second storage electrode is polygonal.]

[17. The OLED display of claim 15, wherein the second storage electrode has a step shape and includes an upper portion and a lower portion.]

[18. The OLED display of claim 17, wherein only the upper portion of the second storage electrode overlaps the driving gate electrode in the depth dimension of the OLED display.]

[19. The OLED display of claim 18, further comprising a switching transistor including a switching drain electrode, wherein the driving transistor further includes a driving source electrode, and wherein the lower portion of the overlaps the switching drain electrode and the drive source electrode in the depth dimension of the OLED display.]

[20. The OLED display of claim 13, further comprising a light emission control line configured to receive a light emission control signal, wherein the light emission control line and the second storage electrode do not overlap in the depth dimension of the OLED display.]

*21. An organic light-emitting diode (OLED) display, comprising:*

*a substrate;*

*a scan line and a storage capacitor line disposed on the substrate and extending in a first direction; and*

*a data line and a driving voltage line crossing the scan line and extending in a second direction crossing the first direction,*

*wherein the storage capacitor line comprises*

*a storage electrode part;*

*a data line cover part connected to the storage electrode part and overlapping a part of the data line; and*

*a connecting part connected to the data line cover part and protruded from the data line cover part to extend in the first direction,*

*wherein a width of the data line cover part in the second direction is larger than a width of the connecting part in the second direction.*

*22. The organic light-emitting diode (OLED) display of claim 21,*

*wherein a width of the storage electrode part in the second direction is larger than a width of the connecting part in the second direction.*

*23. The organic light-emitting diode (OLED) display of claim 21,*

*wherein a width of the storage electrode part in the second direction is greater than a width of the data line cover part.*

*24. The organic light-emitting diode (OLED) display of claim 21,*

*wherein a width of the data line cover part in the second direction is larger than a width of the scan line in the second direction.*

*25. The organic light-emitting diode (OLED) display of claim 21, further comprising:*

*a switching transistor electrically connected to the scan line and the data line;*

*a driving transistor electrically connected to the switching transistor, and*

*a storage capacitor including a first storage electrode and a second storage electrode.*

*26. The organic light-emitting diode (OLED) display of claim 25,*

*wherein the driving transistor includes a driving gate electrode, and*

*wherein the first storage electrode includes the same material as the driving gate electrode.*

*27. The organic light-emitting diode (OLED) display of claim 25,*

*wherein the storage electrode part is the second storage electrode.*

*28. The organic light-emitting diode (OLED) display of claim 27,*

*wherein a planar area of the second storage electrode is greater than a planar area of the first storage electrode.*

*29. The organic light-emitting diode (OLED) display of claim 21,*

*wherein the storage electrode part is electrically connected to the driving voltage line.*

*30. The organic light-emitting diode (OLED) display of claim 21, further comprising:*

*a light emission control line extending in the first direction and transmitting a light emission control signal,*

*wherein the data line cover part is disposed between the scan line and the emission control line in a plan view.*

*31. The organic light-emitting diode (OLED) display of claim 25, further comprising:*

*a pixel electrode electrically connected to the driving transistor;*

*a light emitting layer disposed on the pixel electrode; and*

*a common electrode disposed on the emission layer.*

*32. An organic light-emitting diode (OLED) display, comprising:*

*a substrate;*

*a scan line and a storage capacitor line disposed on the substrate and extending in a first direction; and*

*a data line and a driving voltage line crossing the scan line and extending in a second direction crossing the first direction,*

*wherein the storage capacitor line comprises*

*a storage electrode part;*

*a data line cover part connected to the storage electrode part and overlapping a part of the data line; and*

*a connecting part connected to the data line cover part and protruded from the data line cover part to extend in the first direction, and*

*wherein a width of the data line cover part, a width of the storage electrode part, and a width of the connecting part in the second direction are different from each other.*

*33. The organic light-emitting diode (OLED) display of claim 32, wherein a width of the connecting part in the second direction, a width of the data line cover part in the second direction, and a width of the storage electrode part in the second direction increase in order.*

*34. The organic light-emitting diode (OLED) display of claim 32, further comprising:*

*a switching transistor electrically connected to the scan line and the data line;*

*a driving transistor electrically connected to the switching transistor; and*

*a storage capacitor including a first storage electrode and a second storage electrode.*

*35. The organic light-emitting diode (OLED) display of claim 34, wherein the driving transistor includes a driving gate electrode, and wherein the first storage electrode includes the same material as the driving gate electrode.*

*36. The organic light-emitting diode (OLED) display of claim 35, wherein the storage electrode part is the second storage electrode.*

*37. The organic light-emitting diode (OLED) display of claim 36, wherein a planar area of the second storage electrode is larger than a planar area of the first storage electrode.*

*38. The organic light-emitting diode (OLED) display of claim 32, wherein the storage electrode part is electrically connected to the driving voltage line.*

*39. The organic light-emitting diode (OLED) display of claim 32, further comprising a light emission control line extending in the first direction and transmitting a light emission control signal, and*

*wherein the data line cover part is disposed between the scan line and the emission control line in a plan view.*

*40. An organic light-emitting diode (OLED) display, comprising:*

*a substrate;*

*a scan line and a storage capacitor line disposed on the substrate and extending in a first direction;*

*a data line and a driving voltage line crossing the scan line and extending in a second direction crossing the first direction;*

*a switching transistor electrically connected to the scan line and the data line and including a switching drain electrode;*

*a driving transistor including a driving source electrode electrically connected to the switching drain electrode, a driving drain electrode, and a driving gate electrode including a first storage electrode;*

*the storage capacitor line including a second storage electrode part overlapping the first storage electrode, a data line cover part overlapping a part of the data line, and a connecting part protruded from the second storage electrode part to extend in the first direction; and*

*an emission layer disposed on the driving transistor,*

*wherein a width of the data line cover part, a width of the storage electrode part, and a width of the connecting part in the second direction are different from each other, and*

*wherein the connecting part overlaps a part of the driving drain electrode.*

* * * * *